(12) United States Patent
Moss

(10) Patent No.: US 6,771,162 B1
(45) Date of Patent: Aug. 3, 2004

(54) ACTIVE CELL CROSSPOINT SWITCH

(75) Inventor: William E. Moss, Sunnyvale, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 489 days.

(21) Appl. No.: 09/687,724

(22) Filed: Oct. 12, 2000

(51) Int. Cl.[7] .............................................. H03K 17/00
(52) U.S. Cl. ................................ 340/14.62; 340/14.65; 340/14.69; 340/2.28
(58) Field of Search ........................... 340/2.1, 2.2, 2.8, 340/14.6, 14.61–14.69, 2.28, 2.29; 326/41, 47, 37, 38, 39

(56) References Cited

U.S. PATENT DOCUMENTS

| | | | | |
|---|---|---|---|---|
| 4,973,956 A | * | 11/1990 | Lin et al. ...................... | 340/2.2 |
| 5,047,766 A | * | 9/1991 | Hofmann ..................... | 340/2.29 |
| 5,072,366 A | * | 12/1991 | Simcoe ........................ | 710/317 |
| 5,126,734 A | * | 6/1992 | Harrand ....................... | 340/2.29 |
| 5,159,330 A | * | 10/1992 | Trumpp et al. ............. | 340/2.29 |
| 5,202,593 A | | 4/1993 | Huang et al. | |
| 5,412,380 A | * | 5/1995 | Matsuda et al. ............ | 340/2.29 |
| 5,465,087 A | * | 11/1995 | Cooperman et al. ......... | 340/2.2 |
| 5,530,814 A | * | 6/1996 | Wong et al. ................. | 710/317 |
| 5,559,971 A | * | 9/1996 | Hsieh et al. ................ | 710/317 |
| 5,570,039 A | * | 10/1996 | Oswald et al. ............... | 326/39 |
| 5,734,334 A | * | 3/1998 | Hsieh et al. ................. | 340/2.2 |
| 5,790,048 A | * | 8/1998 | Hsieh et al. ................ | 340/2.26 |
| 5,844,887 A | * | 12/1998 | Oren et al. .................. | 370/218 |
| 5,896,047 A | * | 4/1999 | Zhou ............................ | 326/119 |
| 6,049,225 A | * | 4/2000 | Huang et al. ................. | 326/41 |
| 6,320,412 B1 | * | 11/2001 | Ting et al. .................... | 326/41 |

* cited by examiner

Primary Examiner—Michael Horabik
Assistant Examiner—Nam Nguyen
(74) Attorney, Agent, or Firm—Daniel J. Bedell; Smith-Hill and Bedell

(57) ABSTRACT

A high-speed, low distortion N×M crosspoint switch selectively routes input signals arriving at any of N input terminals to one or more of M output terminals. The crosspoint switch includes a switch cell array having N rows and M columns of switch cells. Each of N input lines convey the input signal arriving at a separate one of the N input signals to each switch cell of a corresponding array row. Each of M output lines convey output signals generated by cells of a corresponding array column to a separate switch output terminal. Each switch cell contains a CMOS tristate buffer and a memory cell for storing data controlling whether the tristate buffer is active or inactive. When a tristate buffer is active, it buffers an input signal appearing on one of the input lines to generate an output signal on one of the output lines. When inactive, a tristate buffer refrains from generating an output signal in response to its input signal. Each tristate buffer is configured so that much of its capacitance is decoupled from its input line when it is inactive so that it has minimal effect of signal propagation rates on its input line.

12 Claims, 5 Drawing Sheets

ACTIVE CELL CROSSPOINT SWITCH

BACKGROUND OF THE INVENTION

1. Field of the Invention

The present invention relates in general to integrated circuit crosspoint switches and in particular to a crosspoint switch having switch cells employing active tristate buffers.

2. Description of Related Art

An N×M crosspoint switch, such as disclosed for example in U.S. Pat. No. 5,790,048 issued Aug. 4, 1998 to Hsieh et al, employs an array of pass transistors to selectively route input signals arriving at any of N input ports to any of M output ports.

FIG. 1 illustrates a simplified example 4×4 crosspoint switch 10 as might be implemented in an integrated circuit. Crosspoint switch 10 includes a set of four input signal drivers D0–D3 acting as input ports, a set of four receivers R0–R3 acting as output ports, a switch cell array 12 for selectively providing signal paths between drivers D0–D3 and receivers R0–R3, and an array controller 14. Crosspoint array 12 includes four rows and four columns of switch cells 16. Each of four conductive input lines H0–H3 lines deliver the output of a separate one of drivers D0–D3 to a separate row of switch cells 16. Each of four conductive output lines V0–V3 lines link a separate column of switch cells 16 to an input of a separate one of receivers R0–R3. Each switch cell 16 can selectively provide a signal path between one of input lines H0–H3 and one of output lines V0–V3. A controller 14 writes single bit control data into a memory cell within in each switch cell 16, and the state of the bit determines whether or not the cell is to provide the signal path. Commands arriving on a control bus 22 from an external source such as a host computer tell controller 14 how to set the states of bits stored in the various switch cells 16.

When, for example, driver D0 receives input signal IN(0) arriving at one of switch input terminals 18, it buffers them onto its corresponding input line H0. Each one of the four switch cells 16 that are linked to input line H0, and which happen to be configured by their stored data bit to provide a signal path, then forwards the signal to one of receivers R0–R3 via its corresponding output line V0–V3. Each receiver R0–R3 that receives the signal then buffers the signal onto one of four switch output terminals 20 as one of output signals OUT(0)–OUT(3).

FIG. 2 illustrates a portion of the prior art crosspoint switch 10 of FIG. 1 in more detail, including driver D0, input line H0, output lines V0–V3, the four cells 16 linking input line H0 to output lines V0–V3 and receivers R0–R3. FIG. 2 also shows driver D0 and receivers R0–R3 of FIG. 1. Each switch cell 16 includes a pass transistor Q having its source terminal connected to input line H0 and its drain terminal connected to one of output lines V0–V3. Each switch cell 16 also includes a memory cell 25 for storing the control bit from controller 14. Controller 14 of FIG. 1 uses a control bus 24 to separately write a bit into the memory cell 25 of each switch cell 16, and that control bit drives the gate of transistor Q. Pass transistor Q of each cell 16 passes signals from input line HO to one of output lines V0–V3 when the bit in memory cell 25 turns the pass transistor on and blocks a signal on line H0 from passing to that output line when the bit turns the pass transistor off.

Although for simplicity array 12 is illustrated as a 4×4 switch cell array, switch cell arrays of similar design can be made much larger to provide flexible routing paths between much larger numbers of input and output ports. Regardless of the dimensions of crosspoint switch 10, we would like the crosspoint switch to route signals with as little delay and distortion as possible. However, crosspoint switch 10 can exhibit significant signal path delay and distortion, both of which can increase as we increase the N×M dimensions of array 12.

Referring to FIG. 2, assume that the pass transistor Q of the switch cell 16 linking input line H0 to output line V0 is on and that the pass transistors Q of all other switch cells 16 are off. When the input signal IN(0) to driver D0 changes state, the output signal OUT(0) produced by driver R0 will also change state with a time delay that is the sum of the inherent delays of driver D0 and receiver R0 and the signal path delay through switch cell array 12. The signal path delay arises primarily because the output signal produced by driver D0 on line H0 must charge or discharge all of the shunt capacitance linked to the input and output lines V0 and H0 before it can force receiver R0 to drive OUT(0) to another state. That shunt capacitance includes not only the inherent capacitance of the lines and the input capacitance of the receiver R0, it also includes capacitance associated with the pass transistor, Q linked to both input line H0 and output line V0, capacitances associated with the pass transistors Q of the three other switch cells 16 that are also connected to input line H0 and the three other transistors Q connected to vertical line V0.

When we increase the size of the array, for example from 4×4 to 8×8, then each input and output line H0 and V0 will now be connected to eight cells, rather than four. Thus driver D0 will have to charge or discharge the capacitances associated with fifteen transistors rather than seven and input capacitances of up to eight receivers instead of four. Since increasing the size of array 12 increases the capacitance linked to its input and output lines, and since signal delay increases with capacitance, we lengthen the signal path delay when we increase array size.

A driver charges a capacitor at a rate in inverse relation to the product of its capacitance and the series resistance between the driver's voltage source and the capacitor. Thus one way to reduce the signal path delay through array 12 is to increase the size of drivers D0–D3 (i.e., reduce their output resistance) so that they conduct more current when charging and discharging capacitance. This reduces the time the drivers need to charge or discharge the capacitance of array 12, thereby reducing signal path delay. However since there are practical limits to the size of a driver we can incorporate into an integrated circuit, we would like to provide another way to reduce signal path delay.

We could reduce signal path delay by reducing the capacitance of pass transistors Q by making them smaller. However since smaller pass transistors have higher resistance, the gain in speed resulting from reduced capacitance can be offset by the increased resistance. Therefore while we can attain some delay reduction by optimizing the tradeoff between the capacitance and resistance of pass transistors Q, there are limits to this approach as well. Therefore it would beneficial to provide yet another way to attain further reductions in signal path delay through array 12.

Signal distortion can be problematic in crosspoint switch 10. In crosspoint switches implemented using metal oxide semiconductor field effect transistors (MOSFETs), pass transistor Q is typically an n-channel metal oxide semiconductor (nMOS) transistor because nMOS transistors normally have lower capacitance than p-channel metal oxide semiconductor (pMOS) transistors of similar size. However since an nMOS transistor's impedance is not symmetric with respect to the direction of its channel current, transistors Q of FIG. 2 charge and discharge capacitance at different rates. Signal path delay is therefore a function of whether an input signal IN(0)–IN(3) is rising or falling. This lack of symmetry results in what is known as "duty cycle" distortion in the OUT(0)–OUT(3) signals wherein rise and fall times of leading and trailing edges are not symmetric. Since increasing the amount of capacitance that drivers D0–D3 must charge and discharge can increase duty cycle distortion, we also increase duty cycle distortion when we increase the N×M dimensions of the crosspoint switch.

What is needed is an architecture for a large crosspoint switch that helps reduce duty cycle distortion and signal path delay.

SUMMARY OF THE INVENTION

A high-speed, low distortion N×M crosspoint switch selectively routes input signals arriving at any of N input terminals to one or more of M output terminals. The crosspoint switch includes a switch cell array having N rows and M columns of switch cells. Each of N input lines convey at a separate one of the N input signals to each switch cell of a corresponding array row. Each of M output lines convey output signals generated by cells of a corresponding array column to a separate switch output terminal.

In accordance with one aspect of the invention, each switch cell contains a tristate buffer and a memory cell for storing data controlling whether the tristate buffer is active or inactive. When the tristate buffer is active, it buffers an input signal received on the its input line to generate an output signal on its output line. When inactive, the tristate buffer refrains from generating an output signal in response to its input signal. Unlike the pass transistors used in prior art switch cell arrays, the tristate buffers actively charge and discharge capacitance of the array's output lines, thereby helping to reduce the signal path delay through the array by providing increased charging currents.

In accordance with another aspect of the invention, the tristate buffers are implemented as complementary metal oxide semiconductor (CMOS) circuits. In comparison to nMOS pass transistors employed in prior art crosspoint switch arrays, CMOS tristate buffers produce less duty cycle distortion in the crosspoint switch's output signals because they can provide relatively symmetric leading and trailing edges in their output signals.

In accordance with a further aspect of the invention, each tristate buffer incorporates CMOS pass gates at its input for decoupling its load transistors from its input line when the tristate buffer is inactive. Since the pass gate de-couples most of the capacitance of the tristate buffer from the switch input line when the buffer is not active, it helps to further reduce signal path delays through the switch array, particularly when the switch cell array is relatively large.

It is accordingly an object of the invention to provide a large, high-speed, low-distortion, crosspoint switch.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

DETAILED DESCRIPTION OF THE INVENTION

Crosspoint Switch Architecture

The present invention relates to an architecture for a large, low-distortion, high-speed, integrated circuit N×M crosspoint switch for selectively routing signals between N input ports and M output ports. Although the crosspoint switch architecture is particularly suited for implementing switches having large numbers of input and output ports, for simplicity a simple 4×4 version of the crosspoint switch is described herein. However it will be apparent to those of skill in the art that the crosspoint switch architecture can be easily scaled up to implement crosspoint switches of large dimensions.

Figure 3:
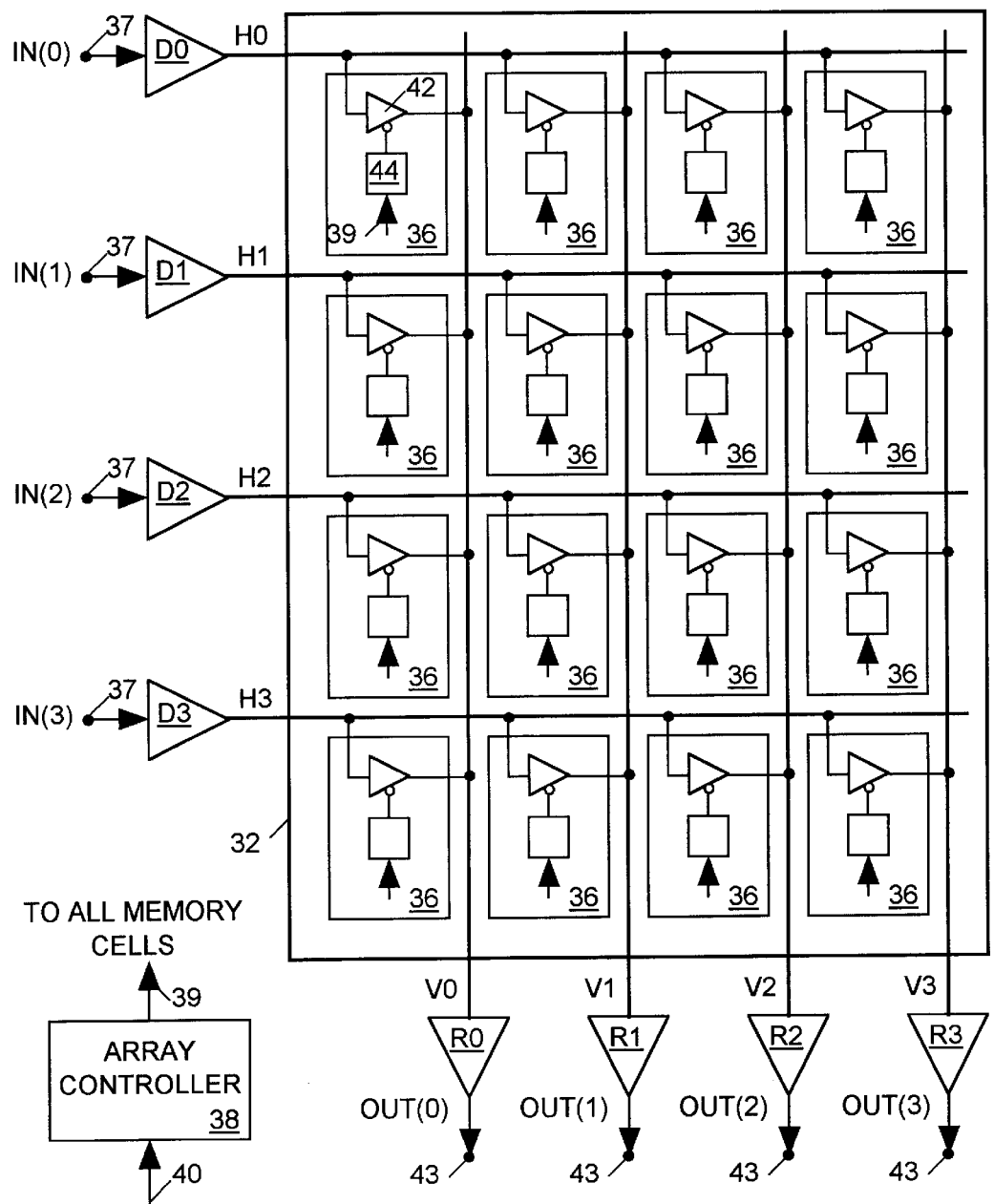
FIG. 3 illustrates a crosspoint switch in accordance with the invention in block diagram form.

FIG. 3 illustrates the example 4×4 crosspoint switch 30 in accordance with the invention. Crosspoint switch 30 includes a set of four drivers D0–D3, a set of four receivers R0–R3, a switch cell array 32 formed by four rows and four columns of switch cells 36, and an array controller 38. Each driver D0–D3 buffers a separate one of a four input signals IN(0)–IN(3) arriving at switch input terminals 37 onto one of four conductive input lines H0–H3. Each input line H0–H3 connects the output of a corresponding one of drivers D0–D3 to a separate row of switch cells 36 while each of four conductive output lines V0–V3 connects a separate column of switch cells to an input of a corresponding one of receivers R0–R3. Each switch cell 36 can either buffer an input signal appearing on one of input lines H0–H3 onto one of output lines V0–V3 or can ignore that input signal and refrain from driving its output line. An array controller 38, linked to all cells 36 via bus 39, can independently set the state of single-bit control data stored in a memory cell 44 within each switch cell 36 to select whether the cell is to buffer or ignore its input signal. Commands arriving on a control bus 40 from an external source such as a host computer tell controller 38 how to set the bit states. Memory cells 44 form, in effect, a 4×4 random access memory (RAM) in which the data bit in each storage location of the RAM controls the operating state of a separate array cell 36. U.S. Pat. No. 5,790,048 issued Aug. 4, 1998 to Hsieh et al, and incorporated herein by reference, describes an array controller for writing data into memory cells of a RAM controlling cells of a crosspoint switch array.

In accordance with one aspect of the invention, each array cell 36 includes a tristate buffer 42 having an input connected to one of input lines H0–H3 and an output for driving one of output lines V0–V3. The bit stored in memory cell 44 drives a control input of tristate buffer 42. When the bit stored in memory cell 44 is of a "true" state, tristate buffer 42 is placed in an "active" mode wherein it actively buffers an signal appearing on one of input lines H0–H3 onto one of output lines V0–V3. When the bit stored in memory cell 44 is "false," tristate buffer 44 is placed in an "inactive" mode (tristated) wherein it does not actively drive its corresponding one of output lines V0–V3.

Each driver D0–D3 receives a separate one of a set of input signals IN(0)–IN(3) arriving at a separate switch input terminal 37 and buffers it onto a corresponding one of input lines H0–H3. Each receiver R0–R3 receives a signal arriving on a corresponding one of output lines V0–V3 and generates a separate output signal OUT(0)–OUT(4) at a separate switch output terminal 43 in response thereto. Thus when any input signal IN(0)–IN(3) changes state, one of drivers D0–D3 causes a state change on its corresponding input line H0–H3. Each one of the four tristate buffers 42 linked to that particular input line that is currently active then changes the state of the signal appearing on its output line. Each receiver R0–R3 that detects a state change in one of output lines V0–V3 then produces a state change in its corresponding one of output signals OUT(0)–OUT(3). Thus by writing bits of appropriate states into memory cells 44 of each switch cell 36, controller 38 can configure array 32 to produce any one or more of output signals OUT(0)–OUT(3) in response to any one of input signals IN(0)–IN(3). Array controller 38 can also configure switch 30 to ignore any input signal IN(0)–IN(3) by placing all of the buffers 42 that are linked to the corresponding input line H0–H3 in their inactive modes.

Figure 1:
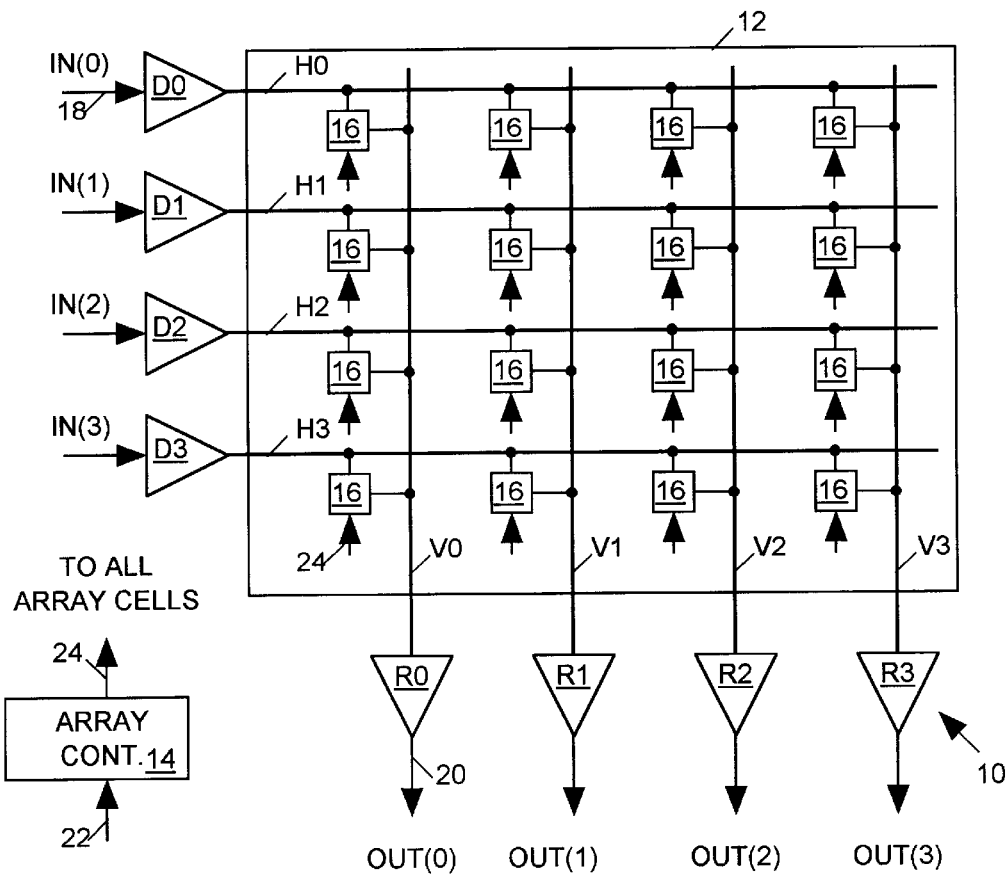
FIG. 1 illustrates a prior art crosspoint switch in block diagram form.
Figure 2:
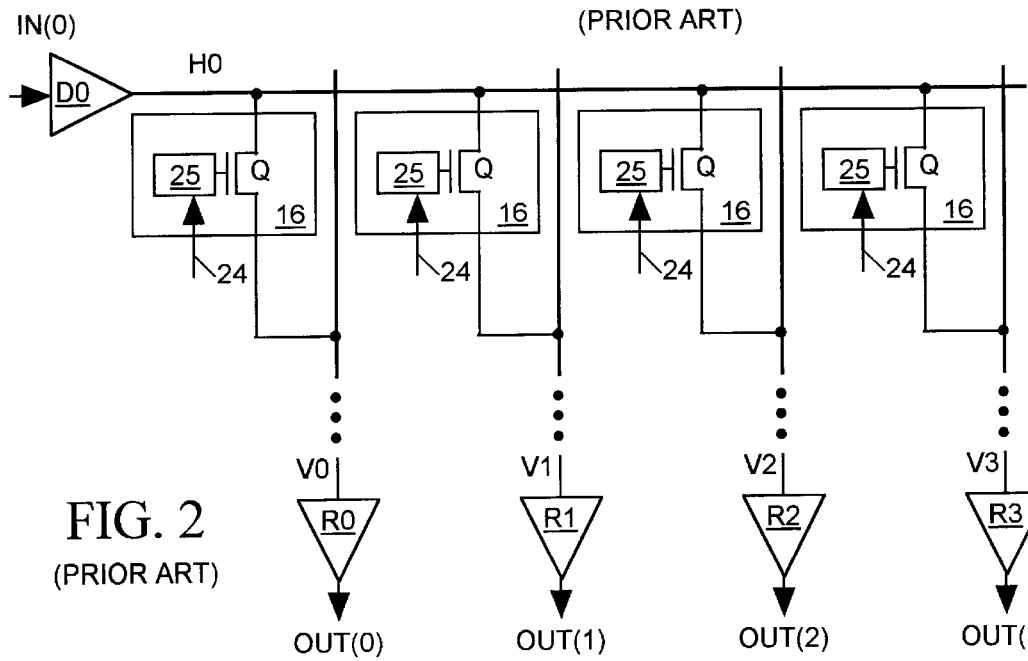
FIG. 2 illustrates a portion of the crosspoint switch of FIG. 1 in more detailed block diagram form.

Unlike the pass transistors Q used in the prior art switch cells of FIG. 2, the tristate buffers 42 of the switch cells 36 of FIG. 3 actively charge and discharge the capacitance of lines V0–V3. Thus tristate buffers 42 help reduce the signal path delay through switch 30 by providing additional charging currents and by de-loading drivers D0–D3 so that all of their output current charges the capacitance only of input lines H0–H3.

Switch Cell Architecture

Figure 4:
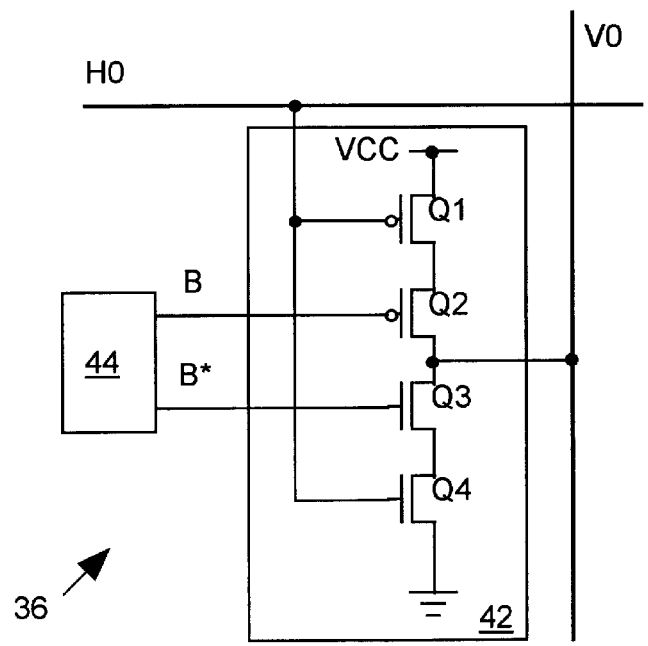
FIG. 4 illustrates an embodiment of a typical switch cell of FIG. 3 in more detailed block and schematic diagram form.

FIG. 4 illustrates one embodiment of the switch cell array cell 36 of FIG. 3 linking input line H0 to output line V0. The other array cells 36 of FIG. 3 are similar. In this embodiment of the invention, tristate buffer 42 is formed by two p-channel metal oxide semiconductor (pMOS) transistors Q1 and Q2 and two n-channel metal oxide semiconductor (nMOS) transistors Q3 and Q4 connected in drain-source series between differing first and second voltage sources, such as a positive voltage source VCC and ground as shown in FIG. 4. The signal on the H0 line controls the gates of transistors Q1 and Q4 while complementary signals B and B* controlled by the bit stored in memory cell 44 respectively control the gates of transistors Q2 and Q3. The drains of transistors Q2 and Q3 drive output line V0. When the bit in memory cell 44 is true, control signals B, B* make tristate buffer 42 active by turning on transistors Q2 and Q3. Thereafter, when the signal on input line H0 goes high, transistor Q1 turns off and transistor Q4 turns on, thereby pulling output line V0 toward ground. Conversely when input line V0 swings to a low logic level, transistor Q4 turns off and transistor Q1 turns on, thereby pulling output line V0 up toward VCC. When the bit stored in memory cell 44 is set false, control signals B, B* turn off transistors Q2 and Q3, thereby placing tristate buffer 42 in its inactive mode wherein it does not drive output line V0.

The CMOS tristate buffer 42 of FIG. 4 can exhibit less duty cycle distortion than the nMOS pass transistor gate Q of the prior art switch cell array switch cell 16 of FIG. 2 because, with complementary transistors Q1–Q4 appropriately selected, it has substantially the same load impedance regardless of whether it is charging or discharging the capacitance of output line V0. Hence, for example, when the rising and falling edges of the signal on input line H0 are symmetric, tristate buffer 42 will produce similarly symmetric rising and falling edges on output line V0.

Alternative Switch Cell Architecture

Figure 5:
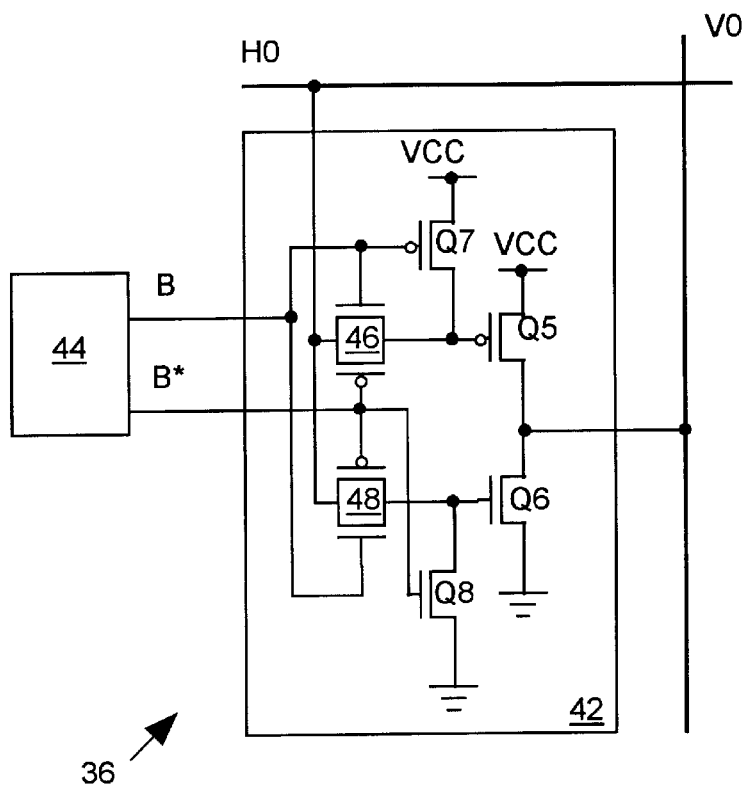
FIG. 5 illustrates an alternative embodiment of a typical switch cell of FIG. 3 in more detailed block and schematic diagram form.

One drawback to the version of the switch cell 36 illustrated in FIG. 4 is that driver D0 of FIG. 3 must charge and discharge the combined gate capacitances of transistors Q1 and Q4 of all four tristate buffers 42 that are connected to input line H0. Since it takes time for driver D0 to charge that capacitance, such capacitance adds to the signal path delay through the switch cell array. As we increase the width of the switch array 32 by increasing the number of output lines V0–V3 and therefore the number of load transistors Q1 and Q4 coupled to each input line H0–H3, we also increase the capacitance on each input line, thereby increasing the signal path delay through crosspoint switch FIG. 5 illustrates a version of array cell 36 of FIG. 3 having a differently configured tristate buffer 42. The tristate buffer 42 of FIG. 5 includes two pMOS transistors Q5 and Q7, two nMOS transistors Q6 and Q8, and a pair of CMOS pass gates 46 and 48. Transistors Q5 and Q6 are connected in source-drain series between VCC and ground with their drains linked to output line V0. The source of transistor Q7 is tied to VCC while its drain is tied to the gate of transistor Q5. The source of transistor Q8 is grounded while its drain is connected to the gate of transistor Q6. CMOS pass gates 46 and 48 respectively link input line H0 to the gates of transistors Q5 and Q6. The complementary B and B* signals reflecting the state of the bit stored in memory cell 44 control pass gates 46 and 48. The B signal also drives the gate of transistor Q7 while the B* signal drives the gate of transistor Q8.

To set tristate buffer 42 to its active mode, array controller 38 of FIG. 3 sets the control bit in memory cell 44 true to drive the B signal high and the B* signal low, thereby turning on pass gates 46 and 48 and turning off transistors Q7 and Q8. When they turn on, pass gates 46 and 48 couple input line H0 to the gates of transistors Q5 and Q6. Thereafter when a signal on input line H0 goes high, transistor Q5 turns off and transistor Q6 turns on, thereby pulling output line V0 toward ground. When the signal on input line H0 swings low, transistors Q6 turns off and transistor Q5 turns on, thereby pulling output line V0 towards VCC.

To place tristate buffer 42 in its inactive mode, array controller 38 of FIG. 3 sets the control bit in memory cell 44 false, thereby driving the B signal low and the B* signal high. The B and B* signals therefore turn off pass gates 46 and 48 and turn on transistors Q7 and Q8. As they turn on, transistors Q7 and Q8 turn off transistors Q5 and Q6 so that they can no longer pull up or down on output line V0.

When pass gates 46 and 48 turn off, they decouple input line H0 from the gates of transistors Q5 and Q6, thereby isolating the gate capacitance of transistors Q5 and Q6 from input line H0. Therefore when tristate buffer 42 is inactive, the only capacitance of switch cell 42 of FIG. 5 that the driver D0 driving input line H0 will have to charge or discharge is that of pass gates 46 and 48, which are relatively small compared to the gate capacitances of transistors Q5 and Q6.

Referring again to FIG. 3, when we implement tristate buffers 42 with the CMOS tristate buffer illustrated in FIG.

4, the gate capacitances of transistors Q1 and Q4 of the cells 36 forming the top row of cell array 32 are always coupled to input line H0 regardless of how many of those tristate buffers are presently active. Therefore the gate capacitance of eight transistors (two each buffer 42) always appear on line H0, contributing to the signal path delay of crosspoint switch 32.

If we instead implement tristate buffers 42 of FIG. 3 with the tristate buffer design illustrated in FIG. 5, then the gate capacitances of each tristate buffer's internal transistors Q5 and Q6 will appear on line H0 only when the tristate buffer is active. Thus, for example, if only the tristate buffer 42 linking input line H0 to output line V0 is active, and the other three buffers 42 linked to input line H0 are inactive, then the driver D0 need only charge or discharge the gate capacitances of only two (not eight) transistors Q5 and Q6 when changing the state of a signal on input line H0. Accordingly crosspoint switch 30 can have a shorter signal path delay when its tristate buffers 42 are implemented as illustrated in FIG. 5, than when implemented as illustrated in FIG. 4. Of course, when all of tristate buffers 42 of the type illustrated in FIG. 5 linked to input line H0 are active, then the gates of all eight load transistors will be linked to that line. In such case the signal path delay would be similar regardless of whether the tristate buffers 42 are of the type illustrated in FIG. 4 or FIG. 5. Thus tristate buffers of the type shown in FIG. 5 provides the greatest signal path delay advantage in applications in which each input signal IN(0)–IN(0) drives only one of output signals OUT(0)–OUT(3) at any given time. The advantage is particularly evident when the switch cell array 30 is expanded so that has a very large number of output lines V(0)–V(3).

The tristate buffer architecture of FIG. 5 is particularly suited for use in very large, high-speed, low-distortion crosspoint switches, because each inactive buffer 42 that is connected to an input line adds relatively little additional capacitance to that input line. However in high-speed applications requiring low signal path delays, such crosspoint switches should not be configured to activate large numbers of tristate buffers along any one input line, since doing so would increase signal path delays.

Bi-directional Active Cell Crosspoint Switch

Figure 6:
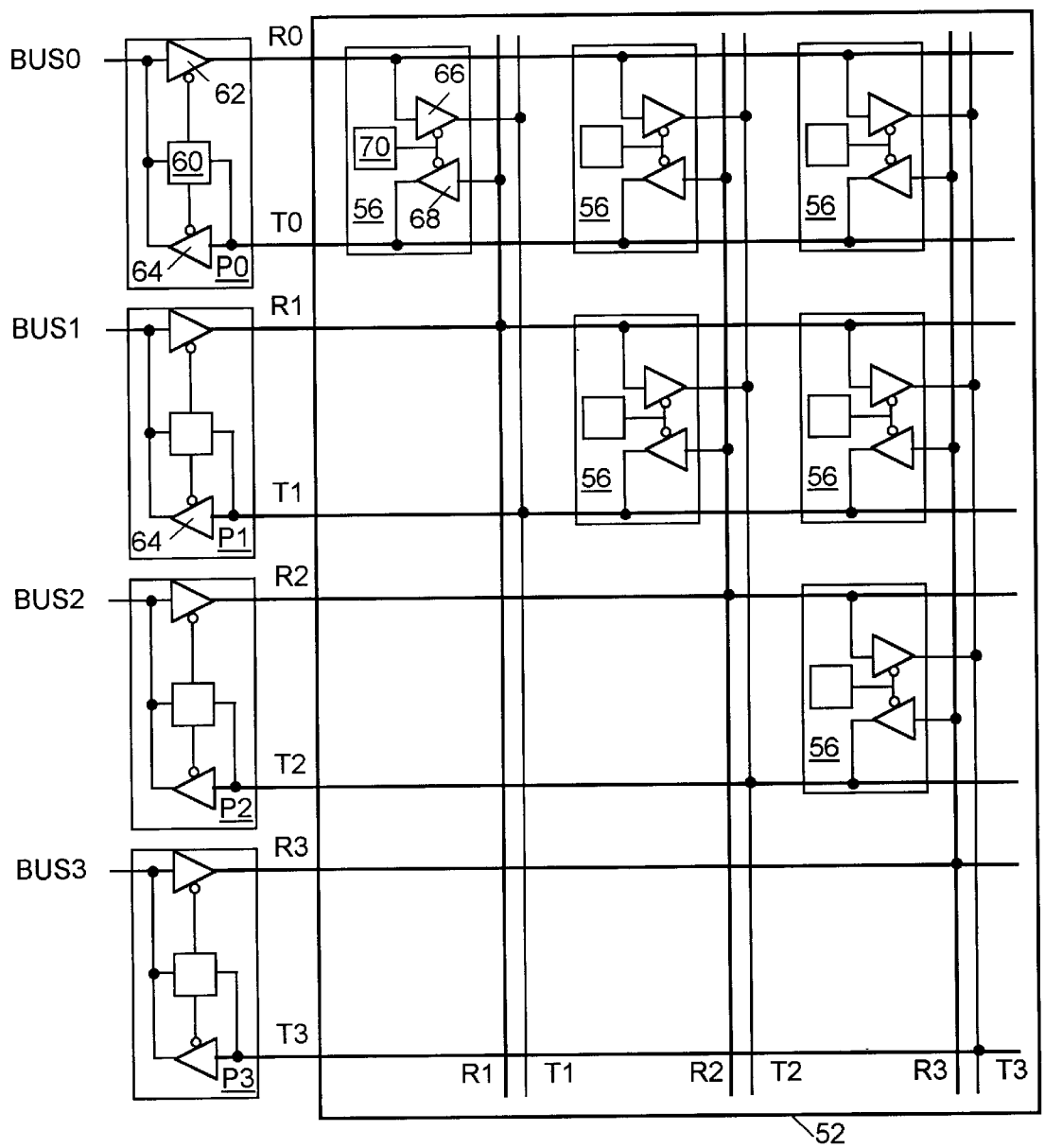
FIG. 6 illustrates in block diagram form a crosspoint switch in accordance with an embodiment of the invention.

Crosspoint switch 30 of FIG. 3 is a "uni-directional" crosspoint switch in that it routes signals between buses IN(0)–IN(3) and OUT(0)–OUT(3) that convey signals in only one direction, either toward/or away from switch 30. FIG. 6 illustrates a "bi-directional" crosspoint switch 50 that routes signals between a set of four buses BUS(0)–BUS(3), each of which can alternatively convey signals either to or away from crosspoint switch 50.

Crosspoint switch 50 includes a set of four bi-directional input/output (I/O) ports P0–P3, a crosspoint array 52 and an array controller 54 71. Crosspoint array 52 includes four "receive" lines R0–R3, four "transmit" lines T0–T3 and a triangular array of switch cells 56. An I/O port suitable for implementing I/O ports P1–P3 is described in detail in U.S. Pat. No. 5,202,593, entitled "Bi-directional Bus Repeater, issued Apr. 13, 1993 to Huang et al and incorporated herein by reference.

I/O port P0 (representative of I/O ports P1–P3) includes a tristate input buffer 62 for buffering signals arriving on bus BUS0 onto the R0 line of array 52 and a tristate output buffer 64 for buffering signals appearing on the T0 line onto bus BUS0. A direction control circuit 60 within port P0 senses whether signals arrive at the input to buffer 62 or at the input of buffer 64 and then activities the appropriate one of buffers 62 and 64 so that it buffers the arriving signal onto its output. Control circuit 60 keeps both buffers 62 and 64 "off" when there is no signal at the input of either buffer. However buffers 62 and 64 include pullup resistors at their outputs so that when they are off, those pullup resistors pull up weakly on their output lines.

When a logic signal arrives on bus BUS0 (i.e. when an external driver pulls bus BUS0 low, overcoming the weak pull up of buffer 64), control circuit 60 turns on buffer 62 so that buffer 62 pulls down hard on R0 overcoming the weak pull up of its own pullup resistor. When the external driver thereafter drives bus BUS0 up or releases the bus allowing driver 64 to weakly pull bus BUS0 up, control circuit 60 turns off tristate buffer 62 which then weakly pulls R0 back up. Conversely, when a logic signal arrives on the T0 line (i.e. when T0 is driven low), control circuit 60 turns on buffer 64 so that buffer 64 pulls down hard on bus BUS0. When T0 subsequently goes high, control circuit 60 turns off tristate buffer 64 which then weakly pulls bus BUS0 back up.

Figure 7:
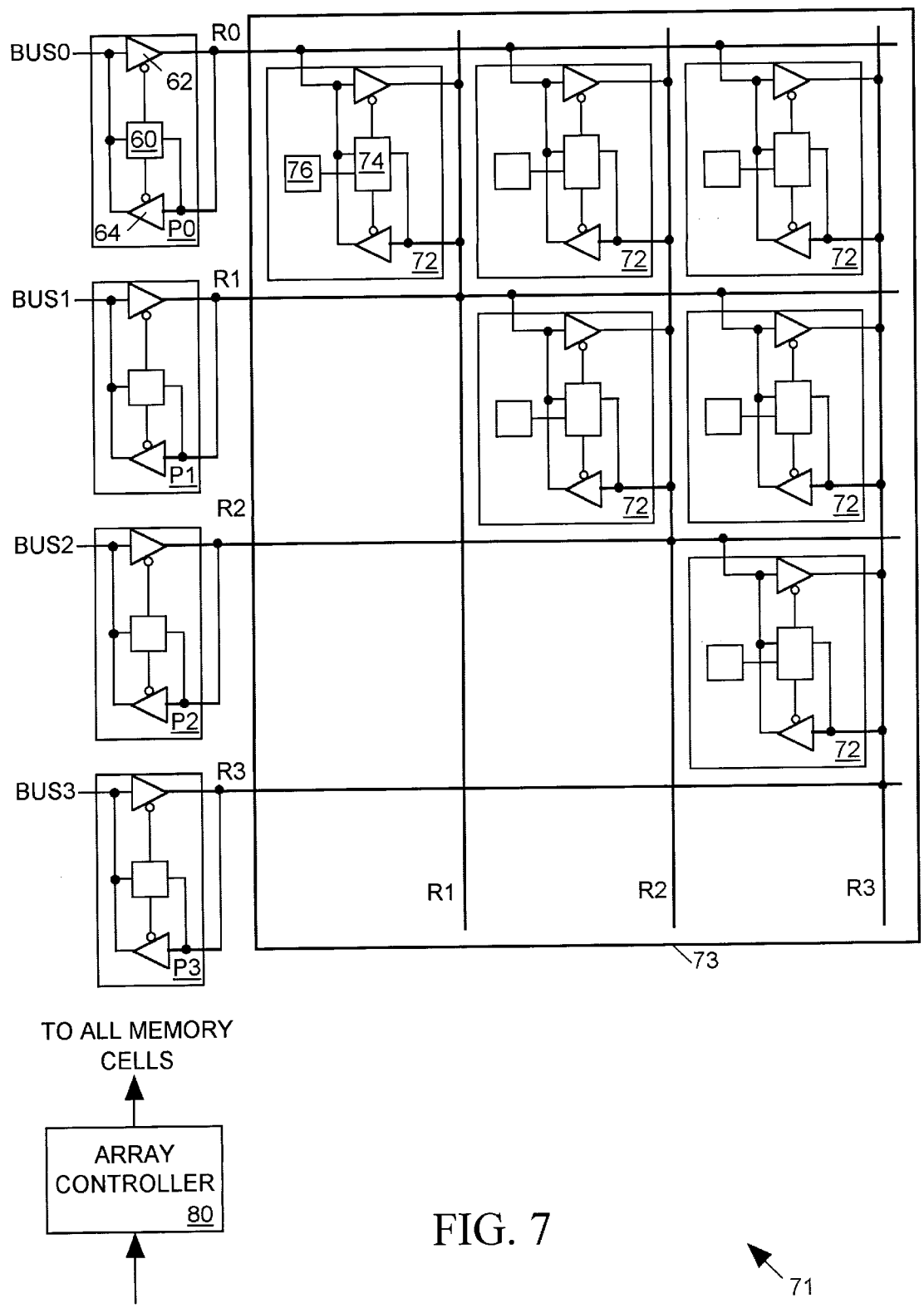
FIG. 7 illustrates in block diagram form a crosspoint switch in accordance with an alternative embodiment of the invention.

Each switch cell 56 includes a pair of tristate buffers 66 and 68 and a memory cell 70 storing a bit for controlling both buffers. Each tristate buffer 66 and 68 of switch cells 56 may be implemented, for example, using either of the tristate buffer circuits 42 of FIGS. 4 or 5. An array controller 71, generally similar to array controller 38 of FIG. 3, writes the control bits to the memory cells 70 of all switch cells 56. When the bit in cell 70 turns on both buffer 66 and 68, buffer 66 buffers signal arriving on one of the receive lines R0–R3 onto one of transmit lines T0–T3. At the same time buffer 68 buffers signal arriving on one of the transmit lines T0–T3 onto one of the receive lines R0–R3. The triangular array of switch cells is arranged so that the transmit and receive lines accessed by any port and line from any one of I/O ports P0–P3 may be actively coupled to receive and transmit lines of any other I/O port. For example, suppose we wish to link bus BUS0 to bus BUS1. Then we set the control bit in the memory cell 70 of the switch cell 56 at the upper left corner of array 52 true, thereby activating its tristate buffers 66 and 68. Then when a signal arrives on bus BUS0 at the input to tristate buffer 62 of port P0, control circuit 60 will turn on that buffer, and buffer 62 will buffer the signal onto the R0 line. The buffer 66 of the switch cell 56 will then buffer the signal arriving on the R0 line onto the T1 line and the T1 line will convey the signal to the input of the tristate output buffer 64 of port P1. The control circuit. 60 within port P1 will then turn on its output buffer 60 so that it will buffer the signal onto bus BUS1. Conversely, when a signal arrives on bus BUS1, port P1 turns on its buffer 62 which then buffers the signal onto line R1. Buffer 68 of the upper left switch cell 56 then buffers the signal onto the T0 line. The direction control circuit 60 of port P0 then buffers the signal onto bus BUS0. While crosspoint switch 50 of FIG. 6 is illustrated as having four ports, it can be expanded to accommodate many more ports simply by increasing the dimensions of the triangular switch array 52 dimensions FIG. 7 illustrates an alternative version of a four port active cell bi-directional crosspoint switch 71. Ports P0–P3 of FIG. 7 are similar to ports P0–P3 of FIG. 6. However in crosspoint switch 71 the T0–T3 lines are eliminated and the R0–R3 lines are connected as inputs to buffers 60 of the ports. Thus, for example, port P0 buffers a signal arriving on bus BUS0 onto R0 when BUS0 goes low before R0, buffers a signal arriving on R0 onto bus BUS0 when R0 is pulled low before BUS0, and otherwise pulls weakly up on bus BUS0 and R0.

Switch 71 includes a triangular crosspoint array 73 of cells 72, each cell selectively linking one of lines R0–R3 to one of the other three lines. Each switch cell 72 includes a memory cell 76 and a bi-directional buffer generally similar in design and operation to bi-directional ports P0–P3 in that they automatically buffer signals in either direction between their two input terminals. An array controller 80 controls the bit state in each memory cell 76 of array 73. For example, the cell 72 in the upper left corner of the array can buffer a signal arriving on line R0 onto line R1, or can buffer a signal arriving on line R1 onto line R0. However the direction control circuit 74 within each switch cell 72 receives an input control bit from the local memory cell 76. That control bit enables or inhibits direction sensing circuit 74. When the control bit is true, the upper left hand switch cell 72 automatically buffers signals in either direction between the R0 and R1 lines. When the control bit in cell 76 is false, that switch cell 72 refrains from buffering signals between R0 and R1. The other switch cells or array 73 behave in a similar manner.

Thus has been shown and described a high-speed, low-distortion crosspoint switch. While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A crosspoint switch for receiving N input signals and for producing M output signals in response to the input signals, wherein M and N are integers greater than 2, the crosspoint switch comprising:

N input lines, each receiving a separate one of said input signals;

M output lines, each conveying a separate one of said output signals; and a switch cell array having N rows of switch cells and M columns of switch cells, wherein each input line conveys its received input signal to each switch cell of a corresponding one of said row N rows of switch cells, wherein each output line is connected to each switch cell of a corresponding one of said M columns of switch cells, and wherein each switch cell of said plurality of switch cells comprises:

a memory cell for storing control data, and a tristate buffer having a control input linked to said memory cell such that the control data stored in the memory cell selects whether the tristate buffer operates in one of active and inactive modes, wherein when operating in said active mode said tristate buffer drives the output signal appearing on the switch cell's corresponding output line to a state determined in response to a state of the input signal conveyed on the switch cell's corresponding input line, and wherein when operating in said inactive mode, said tristate buffer refrains from driving the output signal to any state, wherein the tristate buffer within each switch cell comprises:

a first voltage source;

a second voltage source;

a first pMOS transistor (Q5) having a source terminal tied to said first voltage source, having a drain terminal tied to the output line corresponding to the switch cell, and having a gate terminal;

a second pMOS transistor (Q7) having a source terminal tied to said first voltage source, having a drain terminal tied to the gate terminal of said first PMOS transistor, and having a gate terminal linked to the memory cell within said switch cell such that the control data stored in said memory cell controls a first voltage at that gate terminal, a first nMOS transistor (Q6) having a source terminal tied to said second voltage source, having a drain terminal tied to the output line corresponding to the switch cell, and having a gate terminal;

a second nMOS transistor (Q8) having a source terminal tied to said second voltage source, having a drain terminal tied to the gate terminal of said first nMOS transistor, and having a gate terminal linked to the memory cell within said switch cell such that the control data stored in said memory cell controls a voltage at that gate terminal;

a first pass gate (46) connected between the input line corresponding to said switch cell and the gate terminal of said first pMOS transistor; and a second pass gate (48) connected between the input line corresponding to said switch cell and the gate terminal of said first nMOS transistor, wherein the control data in the memory cell places the tristate buffer in its active mode by turning on said first and second pass gates, and places the tristate buffer in its inactive mode by turning off the first and second pass gates.

2. The crosspoint switch in accordance with claim 1 wherein said first and second pass gates are metal oxide semiconductor pass gates.

3. A crosspoint switch for receiving N input signals and for producing M output signals in response to the input signals, wherein M and N are integers greater than 2, the crosspoint switch comprising:

N input lines;

N input drivers each for buffering a separate one of said input signals onto a corresponding one of said N input lines, M switch output terminals each for providing a separate one of said output signals;

M output lines, each for conveying a separate signal,

M receivers, each connected for buffering the signal conveyed on a separate one of said M output lines onto a separate one of said switch output terminals, a switch cell array having N rows of switch cells and M columns of switch cells, wherein each input line conveys its received input signal to each switch cell of a corresponding one of said row N rows of switch cells, wherein each output line is connected to each switch cell of a corresponding one of said M columns of switch cells, and wherein each switch cell of said plurality of switch cells comprises:

means for storing control data, and a first voltage source;

a second voltage source;

a first p-channel metal oxide semiconductor (PMOS) transistor (Q5) having a source terminal tied to said first voltage source, having a drain terminal tied to the output line corresponding to the switch cell, and having a gate terminal;

a second PMOS transistor (Q7) having a source terminal tied to said first voltage source, having a drain terminal tied to the gate terminal of said first pMOS transistor, and having a gate terminal linked to the memory cell within said switch cell such that the control data stored in said memory cell controls a voltage at that gate terminal;

a first n-channel metal oxide semiconductor (nMOS) transistor (Q6) having a source terminal tied to said second voltage source, having a drain terminal tied to the output line corresponding to the switch cell, and having a gate terminal;

a second nMOS transistor (Q8) having a source terminal tied to said second voltage source, having a drain terminal tied to the gate terminal of said first nMOS transistor, and having a gate terminal linked to the memory cell within said switch cell such that the control data stored in said memory cell controls a voltage at that gate terminal;

a first pass gate (46) connected between the input line corresponding to said switch cell and the gate terminal of said first pMOS transistor;

a second pass gate (48) connected between the input line corresponding to said switch cell and the gate terminal of said first nMOS transistor; and means for selectively turning on said first and second pass gates and turning off said first and second pass gates in response to input control data.

4. The crosspoint switch in accordance with claim 3 further comprising control means for writing the control data into the memory cell within each switch cell.

5. The crosspoint switch in accordance with claim 3 wherein said first and second pass gates are complementary metal oxide semiconductor (CMOS) pass gates.

6. A crosspoint switch for selectively routine input signals arriving at any of N input terminals to one or more of M output terminals, where N and M are integers greater than 2, the crosspoint switch comprising:

an array of tristate buffers having N rows and M columns of tristate buffers;

N input lines, each conveying the input signal arriving at a separate one of the N input terminals to each tristate buffer cell of a corresponding array row; and M output lines, each linked to tristate buffers of a corresponding one of said array columns;

wherein each tristate buffer selectively operates in either of active and inactive modes, wherein when in the active mode, the tristate buffer buffers an input signal appearing on one of the input lines to generate an output signal on one of the output lines and when in the inactive mode, the tristate buffer refrains from generating an output signal in response to its input signal, wherein each tristate buffer has substantially more input capacitance when in its active mode than when in its inactive mode.

7. A tristate buffer comprising:
an output terminal;
an input terminal;
a first control terminal;
a second control terminal;
a first voltage source;
a second voltage source;
a first p-channel metal oxide semiconductor (pMOS) transistor (Q5) having a source terminal tied to said first voltage source, having a drain terminal tied to said output terminal, and having a gate terminal;
a second pMOS transistor (Q7) having a source terminal tied to said first voltage source, having a drain terminal tied to the gate terminal of said first pMOS transistor, and having a gate terminal tied to said first control terminal;

a first n-channel metal oxide semiconductor (nMOS) transistor (Q6) having a source terminal tied to said second voltage source, having a drain terminal tied to said output terminal, and having a gate terminal;

a second nMOS transistor (Q8) having a source terminal tied to said second voltage source, having a drain terminal tied to the gate terminal of said first nMOS transistor, and having a gate terminal tied to said second control terminal;

a first pass gate (46) connected between the input terminal and the gate terminal of said first PMOS transistor;

a second pass gate (48) connected between the input terminal and the gate terminal of said first nMOS transistor.

8. The tristate buffer switch in accordance with claim 7 wherein said first and second pass gates are complementary metal oxide semiconductor (CMOS) pass gates.

9. A crosspoint switch for selectively routing signals between N bi-directional buses, the crosspoint switch comprising:

N receive lines, each corresponding to a separate one of said bi-directional buses;

N transmit lines, each corresponding to a separate one of said bi-directional buses;

N ports, each corresponding to a separate one of said bi-directional buses, each for buffering signals arriving on its corresponding bi-directional bus onto its corresponding receive line, and each for buffering signals arriving on its corresponding transmit line onto its corresponding bi-directional bus; and a switch cell array having a plurality of switch cells,
wherein each switch cell corresponds to a separate pair of said ports,
wherein each switch cell includes a memory cell for storing control data indicating whether the switch cell is to be active or inactive,
wherein when any switch cell is active, it buffers signals arriving on the receive line corresponding to either of its two corresponding ports onto the transmit line corresponding to another of its two corresponding ports, and
wherein when any switch cell is inactive, it refrains from buffering signals arriving on the receive line corresponding to either of its two corresponding ports onto the transmit line corresponding to another of its two corresponding ports.

10. The crosspoint switch in accordance with claim 9 wherein each switch cell comprises:

a first tristate buffer for buffering signals arriving on the receive line corresponding to one of its two corresponding ports onto the transmit line corresponding to another of its two corresponding ports when said first tristate buffer is active and for refraining from buffering signals when said first tristate buffer is inactive;

a second tristate buffer for buffering signals arriving on the receive line corresponding to said another of its two corresponding ports onto the transmit line corresponding to said one of its two corresponding ports when said second tristate buffer is active and for refraining from buffering signals when said second tristate buffer is inactive; and memory cell means for storing s aid control data bit and for controlling when said first and second tristate buffers are active and in accordance with a states of said control data bit.

11. A crosspoint switch for selectively routing signals between N bi-directional buses, the crosspoint switch comprising:

N lines, each corresponding to a separate one of said bi-directional buses;

N ports, each corresponding to a separate one of said bi-directional buses, each for buffering signals arriving on its corresponding bi-directional bus onto its corresponding line, and each for buffering signals arriving on its corresponding line onto its corresponding bi-directional bus; and a switch cell array having a plurality of switch cells,
wherein each switch cell corresponds to a separate pair of said ports,
wherein each switch cell includes a memory cell for storing control data indicating whether the switch cell is to be active or inactive,
wherein when any switch cell is active, it buffers signals arriving on the line corresponding to either of its two corresponding ports onto the line corresponding to another of its two corresponding ports, and
wherein when any switch cell is inactive, it refrains from buffering said signals.

12. The crosspoint switch in accordance with claim 11 wherein each switch cell comprises:

a first tristate buffer for buffering signals arriving on the line corresponding to one of its two corresponding ports onto the line corresponding to another of its two corresponding ports when said first tristate buffer is active, and a second tristate buffer for buffering signals arriving on the line corresponding to said another of its two corresponding ports onto the line corresponding to said one of its two corresponding ports when said second tristate buffer is active, and memory cell means for storing said control data bit and for controlling when said first and second tristate buffers are active and in accordance with a states of said control data bit.

* * * * *

UNITED STATES PATENT AND TRADEMARK OFFICE
CERTIFICATE OF CORRECTION

PATENT NO. : 6,771,162 B1
DATED : August 3, 2004
INVENTOR(S) : William E. Moss

It is certified that error appears in the above-identified patent and that said Letters Patent is hereby corrected as shown below:

Column 9,
Line 41, "row N rows" should be deleted and replace with -- N rows --.

Column 10,
Line 52, "row N rows" should be deleted and replaced with -- N rows --.

Column 13,
Line 1, " a states" should be deleted and replaced with -- a state --.
Line 2, "bit" should be deleted.

Column 14,
Line 19, "a states" should be deleted and replaced with -- a state --.
Line 20, "bit" should be deleted.

Signed and Sealed this

Fourteenth Day of September, 2004

JON W. DUDAS
*Director of the United States Patent and Trademark Office*